United States Patent [19]

Wislocky et al.

[11] 3,831,067

[45] Aug. 20, 1974

[54] SEMICONDUCTOR DEVICE WITH PRESSURE CONNECTION ELECTRODES AND WITH HEADERS CEMENTED TO INSULATION RING

[75] Inventors: Joseph Wislocky, El Segundo; Alan J. Carlan, Palos Verdes Peninsula, both of Calif.

[73] Assignee: International Rectifier Corporation, Los Angeles, Calif.

[22] Filed: May 15, 1972

[21] Appl. No.: 253,200

[52] U.S. Cl....... 317/234 R, 317/234 A, 317/234 E, 317/234 G, 317/234 P, 174/52 S, 174/50.62

[51] Int. Cl.............................. H01l 3/00, H01l 5/00

[58] Field of Search......... 317/234 A, 234 E, 234 F, 317/234 G, 234 H, 234 P, 234 W; 174/52 S, 50.62; 313/250

[56] References Cited

UNITED STATES PATENTS

| | | | |
|---|---|---|---|
| 2,365,518 | 12/1944 | Berkey et al. | 313/250 X |
| 2,373,720 | 4/1945 | Stupakoff | 317/234 X |
| 3,265,805 | 8/1966 | Carlan et al. | 317/234 X |
| 3,457,472 | 7/1969 | Mulski | 317/234 |
| 3,499,095 | 3/1970 | Haus | 317/23 AG |
| 3,559,001 | 1/1971 | Cooper et al. | 317/234 |

FOREIGN PATENTS OR APPLICATIONS

| | | | |
|---|---|---|---|
| 1,188,452 | 4/1970 | Great Britain | 317/234 G |

*Primary Examiner*—Andrew J. James
*Attorney, Agent, or Firm*—Ostrolenk, Faber, Gerb & Soffen

[57] ABSTRACT

A pressure-assembled device has a premolded insulation ring with slots at each end of the ring which receive flexible header rims. The slots are tapered to automatically center the rims and the rims are cemented in the slots. The upper and lower headers and upper and lower main electrodes are identical in construction and the insulation ring is symmetrical. The same components are used for semiconductor devices with or without control electrodes except that a tube is molded in the insulation ring if the device is to have a control electrode.

10 Claims, 3 Drawing Figures

SEMICONDUCTOR DEVICE WITH PRESSURE CONNECTION ELECTRODES AND WITH HEADERS CEMENTED TO INSULATION RING

BRIEF SUMMARY OF THE INVENTION

This invention relates to semiconductor device housings, and more specifically relates to a semiconductor device housing of the type which provides relatively massive flat surface electrodes which can be connected in a circuit by suitable pressure connection to these surfaces.

Devices of the type to which the invention relates are shown typically in U.S. Pat. No. 3,452,254 to Boyer. It is known that economies can be obtained by designing such devices with identical electrodes or pole pieces, and identical flexible diaphragms which carry the pole pieces. It is also known that economies can be obtained when the insulation ring which receives the flexible diaphragms is molded of a thermosetting plastic, with the diaphragm edges captured in the plastic ring. Such arrangements are shown in U.S. Pat. Nos. 3,559,001 to Cooper et al; 3,437,887 to Nowalk et al. and 3,443,168 to Camp et al.

In accordance with the present invention, the insulation ring is a symmetric, premolded plastic ring, and has axially directed and identical slots on the opposite ends thereof. These slots have outwardly tapering cross-sections. Each of the headers or flexible diaphragms are then made of thin steel disks having at least one convolution to impart axial flexibility thereto, and these identical disks are affixed by soldering or brazing to identical pressure pole pieces. The steel disks further contain short, axially directed outer flanges which are to be secured to the insulation ring. Thus, these cylindrical steel flanges, with their subassembled pole pieces, are inserted in the ring slots and are easily loaded into the slot and then automatically centered in the slot, due to its tapered opening. The slot further contains a suitable adhesive or cement which permanently bonds the ring to the steel disks.

The above novel construction and method of assembly allow improved economies in the manufacture of the device. In combination with these features, the pole pieces and steel rings are duplicates of one another and the pole pieces have large area, short thermal flow paths. Where the housing is to be used for a semiconductor wafer having a control electrode, the insulation ring may be molded with a hollow tube therein which can receive the control lead, and then flattened to seal the tube and define a control lead terminal.

DETAILED DESCRIPTION OF THE DRAWINGS

Figure 1:
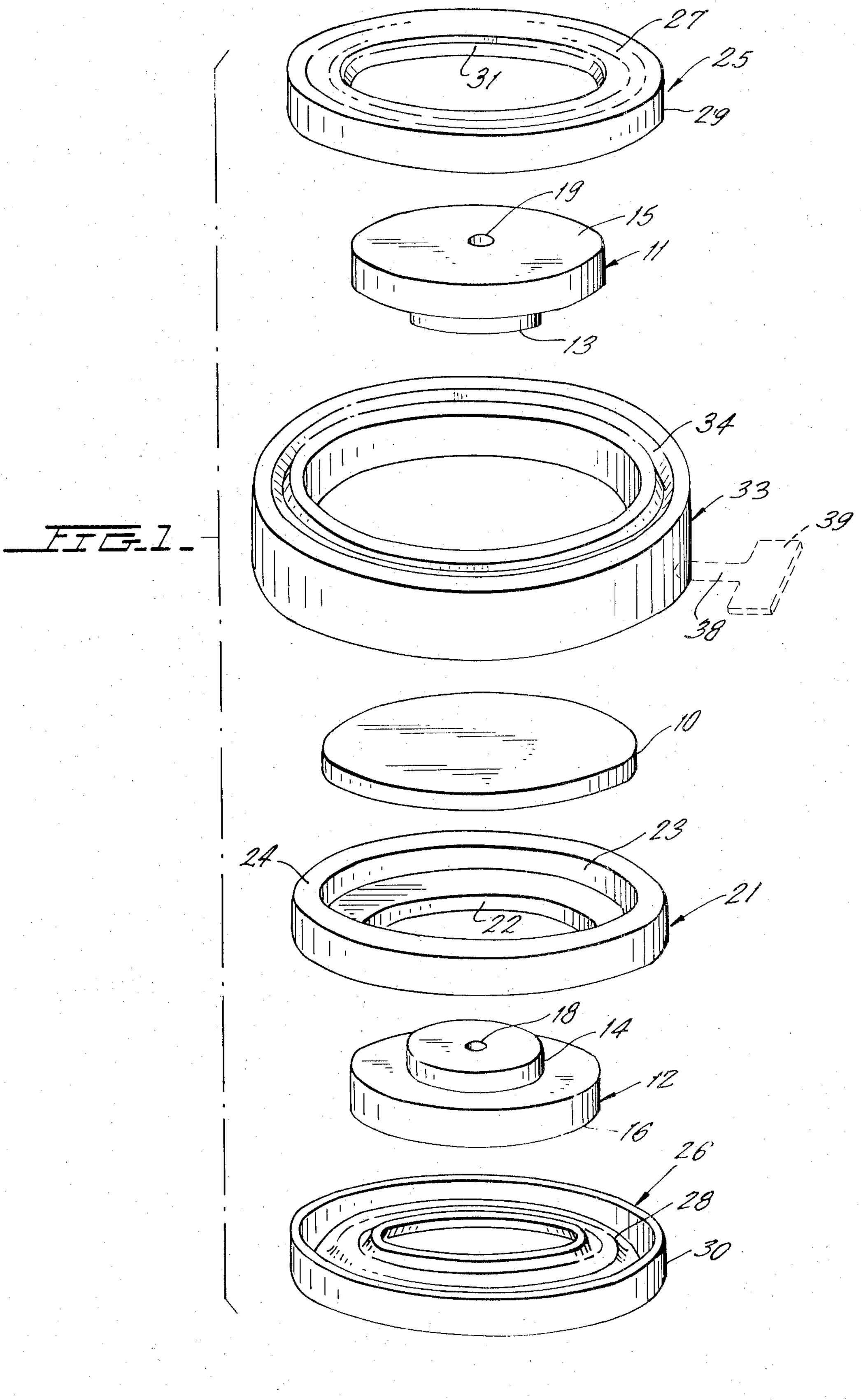
FIG. 1 is an exploded perspective view of the device of the invention.
Figures 2, 3:
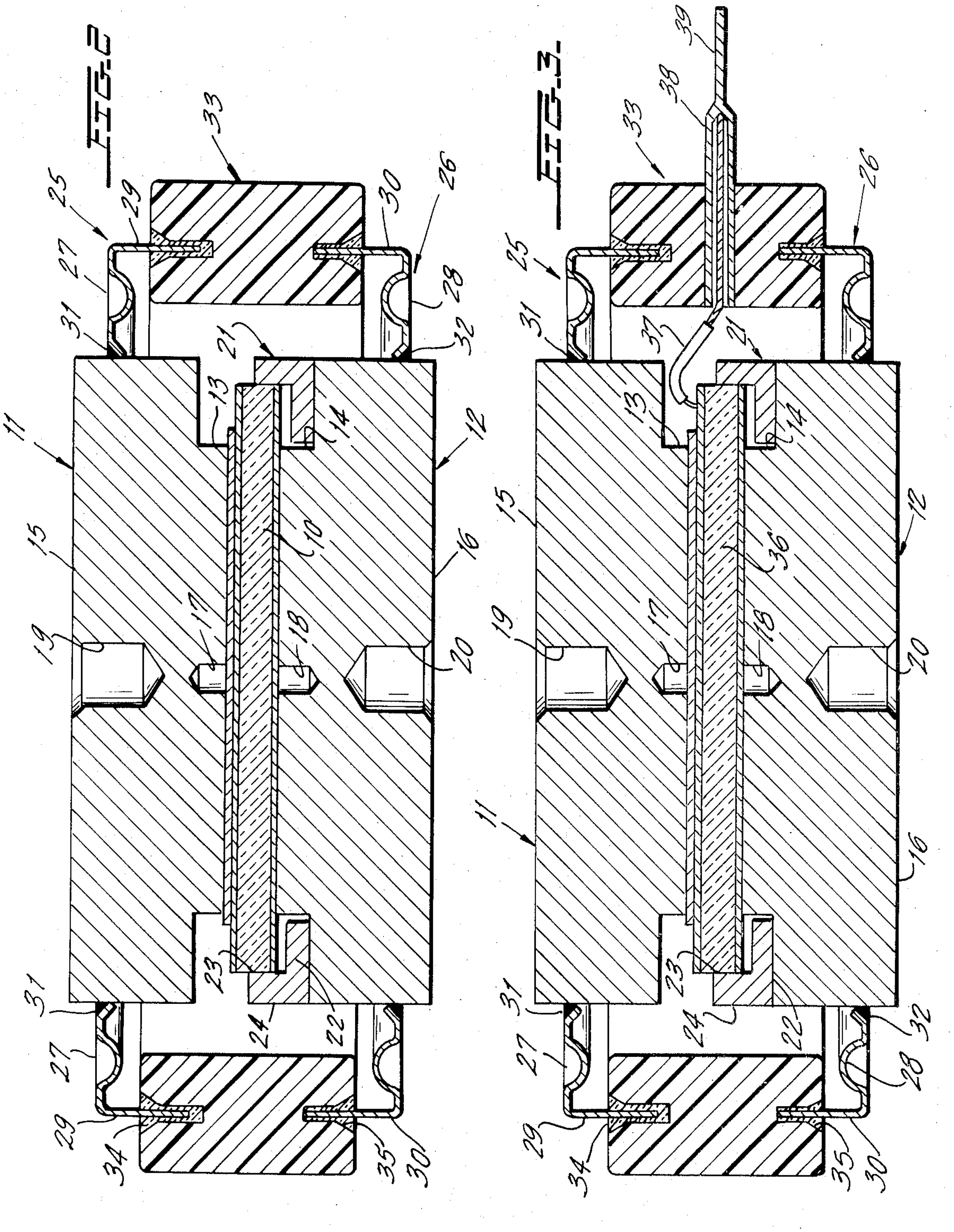
FIG. 2 is a cross-sectional view of the device of FIG. 1 when the device is assembled.
FIG. 3 is a cross-sectional view, similar to FIG. 2, of an embodiment of the invention in which a control electrode passes through the insulation ring.

Referring first to FIGS. 1 and 2, there is shown an embodiment of the invention for housing a diode device. Thus, a conventional wafer assembly 10 contains the active rectifying junction, for example, in a monocrystalline silicon wafer, with the silicon wafer surfaces receiving conventional expansion plates which may be of molybdenum. The outer surfaces of the expansion plates may then contain some softer metal, and preferably will be lapped flat to enable good contact with flat, inner pole surfaces of massive copper pole pieces 11 and 12. The wafer assembly 10 may also be passivated such that the edge of the junction is not exposed to external atmosphere.

Pole pieces 11 and 12 are of identical construction, and include pedestal portions 13 and 14, respectively, which contain the flat, inner pole surfaces which engage respective opposite surfaces of wafer assembly 10. Pole pieces 11 and 12 also have flat and generally parallel outer pole faces 15 and 16, respectively, to which pressure contact may be made to connect the device in a circuit. Note that the interior pole surfaces of poles 11 and 12 contain respective small diameter centering openings 17 and 18, while the outer pole surfaces 15 and 16 contain large diameter centering openings 19 and 20, respectively. Openings 17 and 18 insure that any central projection from pole pieces 11 and 12 caused by machining of the pole pieces are removed.

A centering ring 21, of insulation material, is fitted on pole piece 12, with the ring 21 being centered by the pedestal 14 over which the ring is loosely fitted. Note that shelf 22 of ring 21 has a thickness less than the height of pedestal 14 so that the wafer 10 can seat on the upper surface of pedestal 14. The periphery of wafer 10 is received within the interior diameter 23 of the cylindrical flange 24 of member 21. Note that the axial length of flange 24 is less than the combined heights of pedestals 14 and 13 and wafer 10 so that the ring 21 will not prevent pole piece 11 from contacting the surface of wafer 10.

Two thin steel cups or flexible headers 25 and 26 are then provided which contain disk portions 27 and 28, respectively, having convolutions therein to impart axial flexibility to disk portions 27 and 28. Headers 25 and 26 further have axially directed flanges 29 and 30, respectively, which have lengths approximately equal to the radial dimension of disk portions 27 and 28, respectively. Disk portions 27 and 28 have interior diameters equal to the outer diameters of pole pieces 11 and 12, respectively, and are soldered or brazed to central portions of the pole pieces, as shown by solder beads 31 and 32, respectively (FIG. 2).

An insulation ring 33 is then formed, for example, of a molded plastic which is premolded, or formed prior to the assembly of the device. Two slots 34 and 35, having substantially identical shapes and diameters, and having outwardly tapered openings, are formed in the opposite ends of ring 33. Slots 34 and 35 differ only in that slot 34 is slightly deeper than slot 35. Slots 34 and 35 have radial widths toward their bases which are slightly greater than the thickness of flanges 29 and 30, respectively. Thus, flanges 29 and 30 can be easily inserted into slots 34 and 35 because of their tapered openings, and are automatically centered relative to ring 33 as they enter the narrow base portion of the slots.

Slots 34 and 35 are filled with a suitable adhesive or cement which secures headers 25 and 26 to the ring 33. One suitable adhesive is Biggs Bonding Agent (Epoxy) R-393.

To assemble the device of FIGS. 1 and 2, ring 33 is premolded with slots 34 and 35 formed as shown. Headers 25 and 26 are soldered or brazed to pole pieces 11 and 12, as shown. Slot 35 is then filled with an adhesive and flange 30 of header 26 is loaded into slot 35, and the adhesive is cured by heating. Note that flange 30 reaches the bottom of slot 35. A preformed and pretested wafer 10 and a centering ring 21 are then loaded onto the pedestal 14 of pole piece 12, with the surface of the pedestal 14 engaging the bottom of wafer 10. An adhesive is then loaded into slot 34 of ring 33 and the flange 29 is inserted through the adhesive and into slot 34. A weight is placed on top of pole piece 11 to allow flange 29 to seek its own depth in slot 34 when the bottom of pedestal 13 engages the upper surface of wafer 10. In this manner, the effect of accumulated tolerances of all parts will not interfere with proper assembly of the device. Thereafter, the adhesive in slot 34 is cured by heating to rigidly hold the assembly together. Note that, prior to cementing, a small hole is formed in diaphragm 25 to permit escape of air during the epoxy curing operation. After the cement is cured, this small opening (not shown) is soldered closed.

If desired, the completed assembly can be filled with an inert gas to hermetically enclose wafer 10.

In use, the assembly is clamped between conductive terminal surfaces which engage surfaces 15 and 16 under pressure. The flexible disk portions 27 and 28 of headers 25 and 26, respectively, allow the necessary flexing or movement of pole pieces 11 and 12 to respond to the clamping pressures and to allow thermal expansion and contraction movement of wafer 10, and to cause good electrical contact between the pole pieces 11 and 12 and wafer 10.

The present invention also permits the mounting of devices having control electrodes as well as two electrode diode type devices. Thus, in FIG. 3, the diode wafer assembly 10 of FIG. 2 is replaced by a controlled rectifier wafer assembly 36. Note that in FIG. 3 all components similar to those of FIGS. 1 and 2 have the same identifying numerals. The assembly of FIG. 3 is similar to the assembly 10 of FIG. 2 except that a gate lead 37 extends from the upper surface of the wafer. Thus, during assembly of the device, care must be exercised to load the wafer 36, such that lead 37 is on the opposite side of retainer 21.

In the controlled rectifier version, an opening is drilled in ring 33 and conductive tube 38 is fitted through the hole and is cemented to the ring 33. The control lead 37 is then inserted into tube 38 for its full length, prior to covering the assembly with header 25 and pole piece 11, and the end of tube 38 is flattened at portion 39 to close and seal the tube 38, and to define a gate terminal for the device. This tube 38 and terminal 39 are shown in dotted lines in FIG. 1. In all other respects, the device is constructed and assembled in the same way as the device of FIGS. 1 and 2. Moreover, the same pole piece, header, and centering ring are used in all embodiments to simplify inventory and assembly techniques.

Although there has been described a preferred embodiment of this novel invention, many variations and modifications will now be apparent to those skilled in the art. Therefore, this invention is to be limited, not by the specific disclosure herein, but only by the appended claims.

We claim:

1. A semiconductor device comprising, in combination:

a semiconductor wafer assembly having opposed flat parallel surfaces;

first and second conductive pole pieces each having first surfaces in surface-to-surface contact with said opposed flat parallel surfaces, respectively, of said wafer assembly and second outer surfaces for connection to exterior circuits;

first and second headers connected to said first and second pole pieces and each having disk portions and axially directed cylindrical flange portions extending from the outer peripheries of said disk portions, at least one of said headers having axial flexibility;

an insulation ring surrounding said first and second pole pieces and said wafer assembly; said insulation ring having first and second opposing end surfaces; and first and second cylindrical slots entering said first and second end surfaces of said ring and being coaxial with one another; said slots having bottoms which are spaced from one another by the material of said insulation ring;

said cylindrical flange portions of said first and second headers extending into said first and second slots, respectively; and a cured adhesive means which is sufficiently fluid in its uncured state to conform to the shapes of said first and second slots; said adhesive means disposed in said first and second slots and permanently connecting said insulation ring and said cylindrical flange portions of said first and second headers;

and wherein said slots have tapered openings to permit the easy insertion of said cylindrical flange portions therein during the assembly of said device, and wherein bottom portions of said slots have a constant width only slightly larger than the thickness of said cylindrical flange portions, thereby to accurately center said headers relative to said ring.

2. The combination of claim 1 wherein said first and second slots have the same diameter, and wherein said first and second headers have an identical construction, and wherein said first slot has a greater depth than said second slot.

3. The combination of claim 1 wherein said insulation ring is of a plastic material which is molded to shape prior to assembly of said device.

4. The combination of claim 1 wherein said pole pieces have an identical construction.

5. The combination of claim 1 wherein said first and second slots have the same diameter, and wherein said first and second headers have an identical construction, and wherein said pole pieces have an identical construction.

6. The combination of claim 1 wherein said first and second slots have the same diameter, and wherein said first and second headers have an identical construction, and wherein said pole pieces have an identical construction, and wherein said insulation ring is of a plastic material which is molded to shape prior to assembly of said device.

7. The combination of claim 1 which further includes a pedestal extending from said first pole piece and a centering ring having a disk-shaped portion and a flange extending from the outer periphery of said centering ring; said disk-shaped portion fitting over said pedestal and being centered thereby; said wafer assembly being received within said flange of said centering ring and thereby being centered on said pedestal.

8. The combination of claim 1 wherein said wafer assembly has a control lead extending therefrom; said insulation ring having a conductive tube embedded therein and extending through the radial width thereof; said control lead extending into said tube from the interior side of said insulation ring and electrically connected thereto; said tube extending beyond the outer side of said insulation ring and forming a control lead terminal.

9. The combination of claim 8 wherein said second pole piece has a construction identical to that of said first pole piece.

10. The combination of claim 9 wherein said insulation ring is of a plastic material which is molded to shape with said tube captured therein prior to the assembly of said device.

* * * * *